(12) United States Patent
Baumgartner et al.

(10) Patent No.: US 7,485,945 B2
(45) Date of Patent: Feb. 3, 2009

(54) INTEGRATED CAPACITOR STRUCTURE

(75) Inventors: Peter Baumgartner, München (DE); Philipp Riess, München (DE); Thomas Benetik, München (DE); Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 49 days.

(21) Appl. No.: 11/538,227

(22) Filed: Oct. 3, 2006

(65) Prior Publication Data

US 2007/0181924 A1 Aug. 9, 2007

(30) Foreign Application Priority Data

Oct. 4, 2005 (DE) ............... 10 2005 047 409

(51) Int. Cl.
 *H01L 29/00* (2006.01)
(52) U.S. Cl. .................. 257/532; 257/758
(58) Field of Classification Search .......... 257/532, 257/534, 535, 758; 361/303
 See application file for complete search history.

(56) References Cited

U.S. PATENT DOCUMENTS

| | | | |
|---|---|---|---|
| 4,561,008 A | 12/1985 | Becke | |
| 5,763,911 A * | 6/1998 | Matthews et al. | 257/301 |
| 5,828,106 A * | 10/1998 | Sato | 257/350 |
| 6,084,285 A | 7/2000 | Shahani et al. | |
| 6,518,604 B1 | 2/2003 | Worley et al. | |
| 6,653,681 B2 * | 11/2003 | Appel | 257/307 |
| 2002/0093780 A1 | 7/2002 | Hajiniri et al. | |

OTHER PUBLICATIONS

"German Office Action in German Application No. 2005P51642DE", (May 23, 2006),5 pgs.

* cited by examiner

*Primary Examiner*—Mark Prenty
(74) *Attorney, Agent, or Firm*—Schwegman, Lundberg & Woessner, P.A.

(57) ABSTRACT

A semiconductor component includes an integrated capacitor structure embodied at least partly in an electrically conductive plane and which is patterned such that a multiplicity of strip elements are present. A first group of strip elements constitutes a first electrode of the capacitor structure and a second group of strip elements constitutes a second electrode of the capacitor structure. The first strip elements together with the second strip elements being at least partly interlinked in one another, and at least one strip element may have a non-constant width along its length.

7 Claims, 8 Drawing Sheets

INTEGRATED CAPACITOR STRUCTURE

CLAIM OF PRIORITY

This application claims priority under, 35 USC 119 from German Application No. 10 2005 047 409.9 filed Oct. 4, 2005, which application is incorporated herein by reference and made a part hereof.

TECHNICAL FIELD

The subject matter relates generally to apparatus and methods used in connection with electronic circuit elements, including energy storage elements, such as capacitors.

BACKGROUND

Semiconductor circuit technology generally requires integrated capacitor structures having high fabrication quality and reproducibility with, at the same time, a high capacitance value and a small area requirement. In addition, due to increases in operating frequencies, good radio frequency (RF) properties of integrated capacitor structures may be required.

DETAILED DESCRIPTION

The embodiments described herein are merely illustrative. Therefore, the embodiments shown should not be considered as limiting of the claims.

Figure 1:
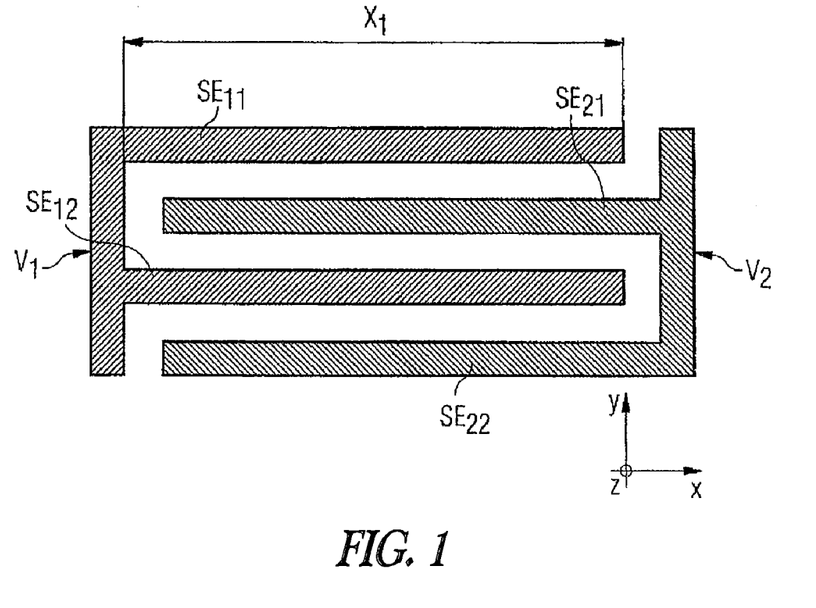
FIG. 1 shows a plan view of an integrated capacitor structure including two strip elements according to the prior art.

FIG. 1 illustrates an integrated capacitor structure known from the prior art, said structure usually being realized within a lateral plane of a semiconductor component. Vertical arrangements are also possible, however, and they generally have a smaller capacitance value on account of the relatively large distances required between two wiring planes.

Two respective strip elements $SE_{11}$ and $SE_{12}$ having a first polarity and having a second polarity $SE_{21}$, $SE_{22}$ are alternatingly arranged, interlinked with one another and connected to a respective connecting element $V_1$ and $V_2$. It is appropriate in this case for a respective strip element having the first polarity together with a respective strip element having the second polarity to be regularly alternately interlinked with one another.

The total capacitance realized in this arrangement, in the case of the lateral embodiment, besides the length $x_l$ of the strip elements, may be dependent on the distance between the strip elements SE that are interlinked with one another and the thickness thereof, that is to say the extent thereof in the z direction. In radio frequency (RF) applications, however, with these structures problems may occur due to the voltage drops along the strip elements.

Since the capacitance per unit length along the strip elements is constant, the electrical charge-reversal current depends linearly on the position along the strip elements. This holds true within an approximation according to which the voltage drops are small in comparison with the applied voltage. This linear current dependence leads to a quadratic voltage dependence.

Figure 2:
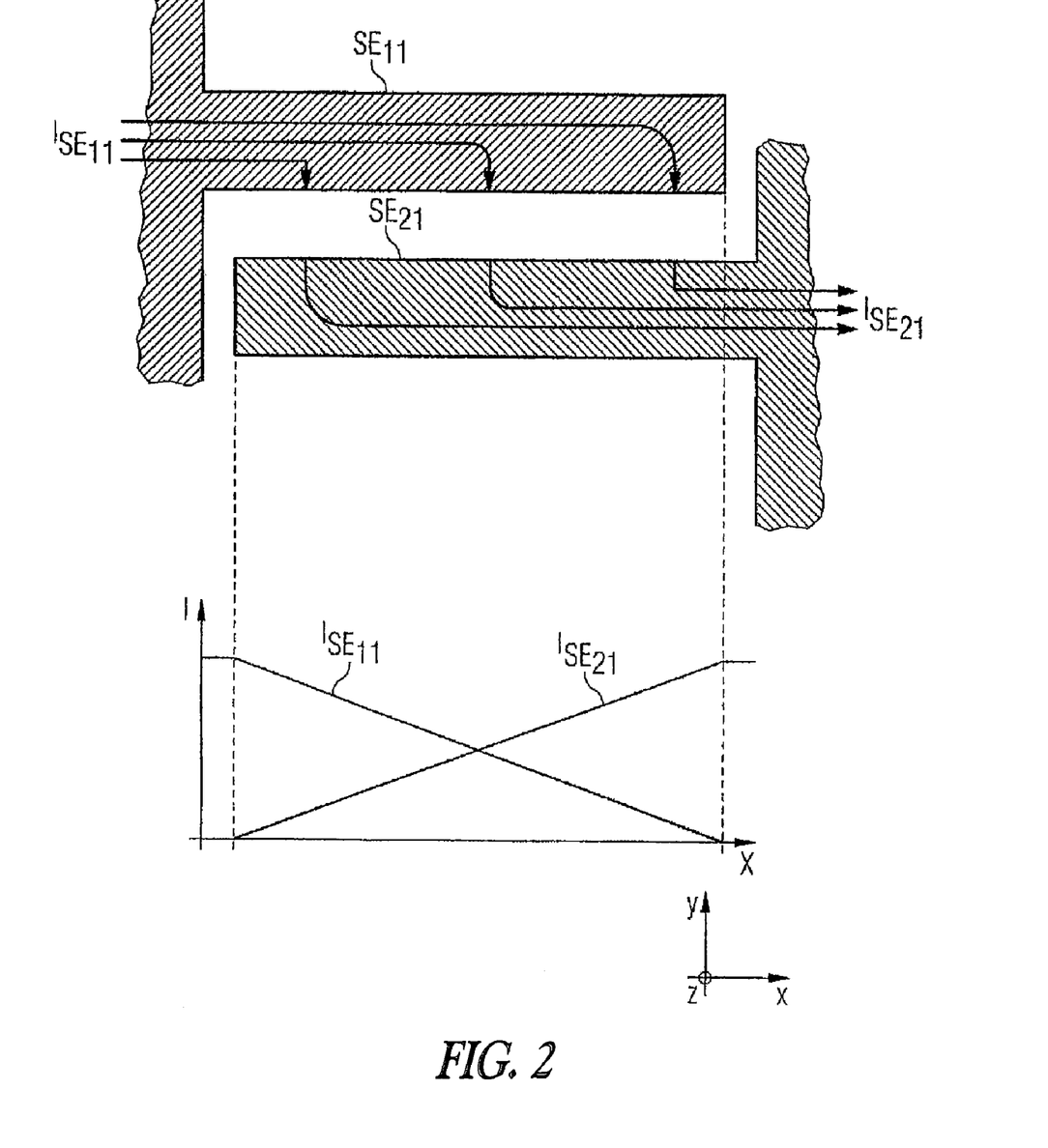
FIG. 2 shows an illustration of a current profile along two strip elements of a capacitor structure according to the prior art.

FIG. 2 schematically shows the profile of the charge-reversal currents $I_{SE11}$ and $I_{SE21}$ along the strip elements $SE_{11}$ and $SE_{21}$ within a capacitor structure that is known according to the prior art and described in FIG. 1. It can be established that the charge-reversal currents flowing in the strip elements decrease linearly with increasing distance from the respective connection sides.

Figure 3:
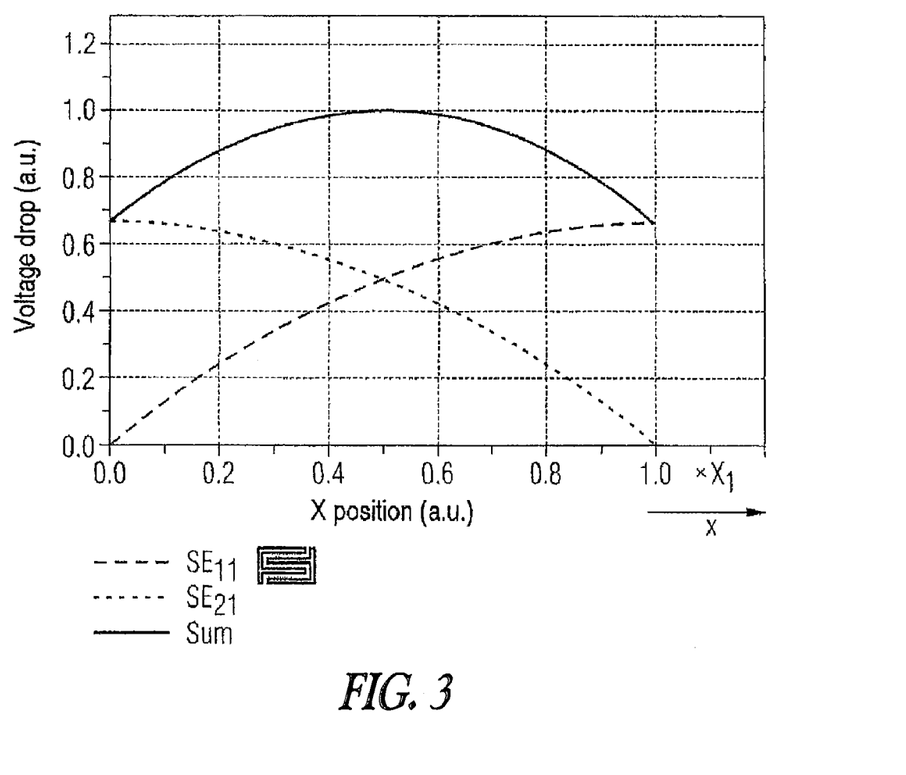
FIG. 3 shows an illustration of the profile of the voltage drop along an integrated capacitor structure comprising two strip elements according to the prior art.

FIG. 3 shows the profile of the voltage drop along the strip elements $SE_{11}$ and $SE_{21}$ in a lateral capacitor structure constructed in accordance with the geometry shown in FIG. 1. These geometrical relationships result in a nonlinear dependence of the voltage drop on the x position. As a result, the summation signal composed of the two signals has a local maximum. On account of the charge-reversal currents associated therewith, this leads to impaired RF properties, that is to say that the effective capacitance decreases as the operating frequency increases.

Figure 4:
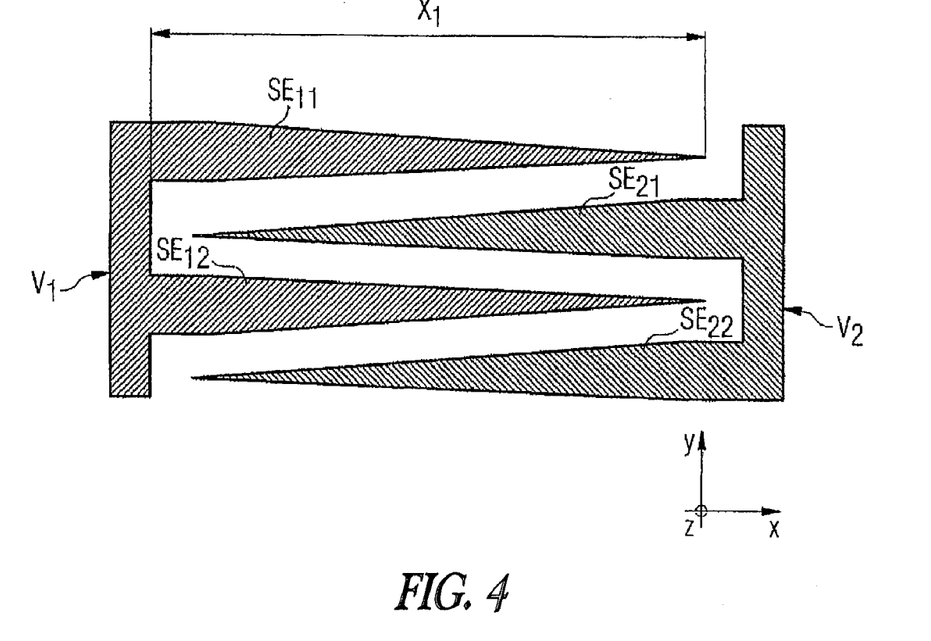
FIG. 4 shows a plan view of embodiments of an integrated capacitor structure in accordance with some embodiments.

FIG. 4 shows embodiments of an integrated capacitor structure with two respective strip elements, having a first polarity $SE_{11}$ and $SE_{12}$ together with two strip elements having a second polarity $SE_{21}$ and $SE_{22}$ once again being alternatingly arranged, interlinked with one another, and connected to a respective associated connecting element, $V_1$ and $V_2$ to form first and second capacitor plates. In this case, the strip elements are each embodied having a non-constant width along their length with the width diminishing toward a free end thereof, each of the strip elements tapering as acute-angle triangles in the x-y plane. This embodiment ensures that a large cross-section is present in regions having a high current density and a small cross-section is present in regions having a low current density. As a result, the strip elements may be joined together more densely, which may result in an increase in the capacitance density and an improvement in the RF properties.

In other embodiments, a semiconductor component may include at least one strip element embodied in such a way that the cross-section tapers in stepped fashion towards a free end. Accordingly, structure boundaries that are orthogonal to one another occur, which may simplify the lithographic structure production. In one embodiment, at least one strip element includes two parallelepipedal partial strip elements having different cross-sections abutting each other. Keeping the lateral distances between two corresponding strip elements constant may improve capacitance.

Figure 5:
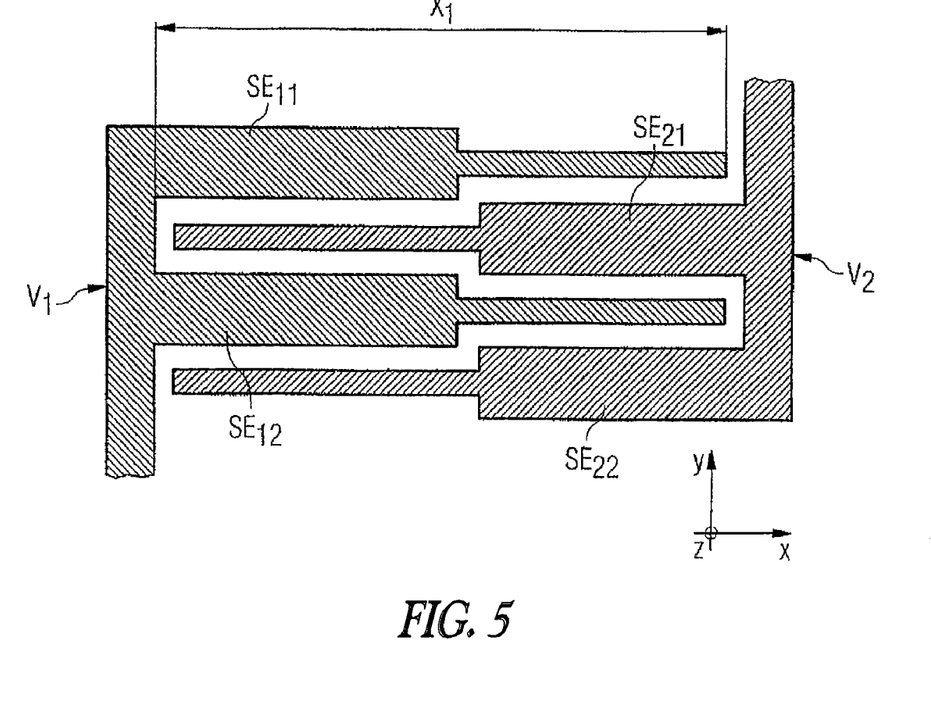
FIG. 5 shows a plan view of an integrated capacitor structure in accordance with some embodiments.

A second embodiment is shown in FIG. 5. Once again, two respective strip elements having a first polarity $SE_{11}$ and $SE_{12}$ together with two strip elements having a second polarity $SE_{21}$ and $SE_{22}$ are interlinked with one another and connected to a respective associated connecting element, $V_1$ and $V_2$. However, in some embodiments, the reduction of the cross-section of the strip elements is now effected in stepped fashion. In some embodiments, the strip elements do not taper continuously along their longitudinal direction; rather, the strip width decreases by a specific magnitude approximately at ½×l. In some embodiments, the strip width may be reduced for example by approximately 50%. The thickness of the strip elements, in the z axis, may not be altered in some embodiments.

In some embodiments, the contours of the strip elements lie in the direction of the x axis or perpendicular thereto; that is to say along the y axis. This choice of the contours enables a simple production that, in some embodiments, is advantageous for the chip deign, in particular for the chip layout and the lithography. In some embodiments, a progressive stepped reduction of the cross section is used, so that, given a large number of steps, an approximately triangular plan of the stepped elements is ultimately realized again.

Figure 6:
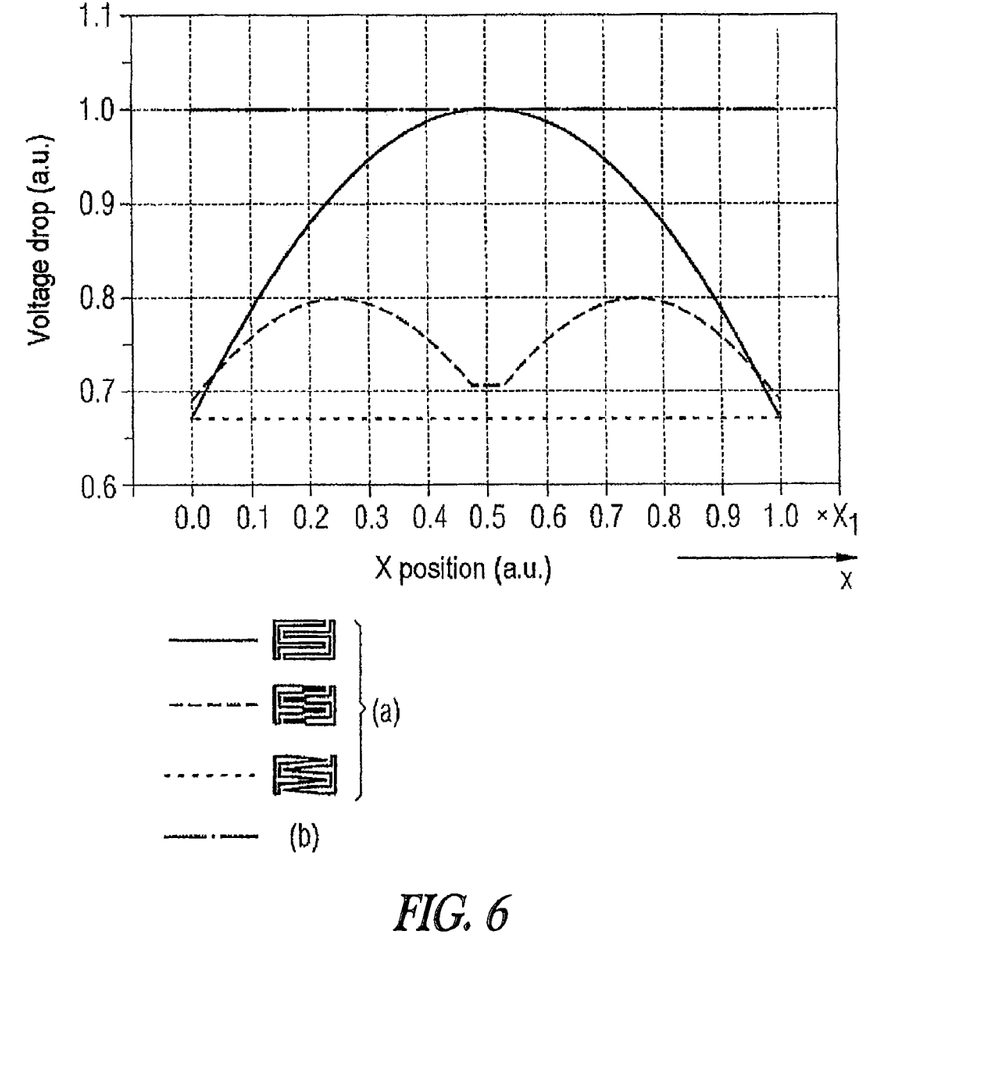
FIG. 6 shows a comparison of the profiles of the voltage drops between the embodiments illustrated in FIG. 4 and FIG. 5 with the prior art as illustrated in FIG. 1.

A comparison of the summational voltage drop of a conventional construction and two embodiments of integrated capacitor structures shown in FIGS. 1, 4 and 5 respectively is given in FIG. 6, cf. group (a) of the curves shown. In some embodiments, the distance between the strip elements SE may be kept constant in this case. In some embodiments, in order to limit the charge-reversal currents occurring at high frequencies, the summational voltage drop is intended to be as small as possible. While the largest summational voltage drop is present for a configuration of the strip elements constructed in accordance with the prior art, in some embodiments, a significant decrease in the voltage drop is shown in the case of embodiments with a two-stage cross-sectional reduction of the strip elements in accordance with FIG. 6. A small voltage drop may be recorded for a wedge-shaped form of the strip elements.

If the RF properties are of lesser importance and the capacitor structure may be improved with regard to the capacitance density, curve (b) is applicable. In some embodiments, an estimated area saving of approximately 33% can typically be expected with wedge-shaped strip elements. With the distances between the individual strip elements further being taken into account, embodiments having an estimated total area saving of approximately 22% may be obtained for the capacitor structure.

Figure 7:
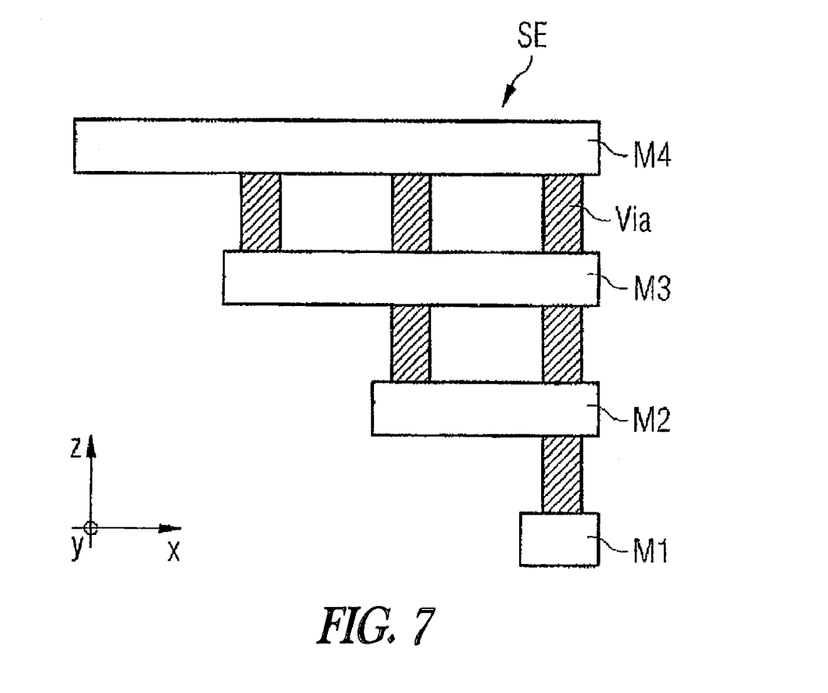
FIG. 7 shows a side view of an individual capacitor plate in accordance with some embodiments.

The foregoing embodiments show that the cross-sectional reduction of strip elements may be obtained by reducing the dimensions in the x-y plane. The dimensions in the z direction have heretofore remained unchanged. However, as can be seen in FIG. 7, a cross-sectional reduction is also possible by reducing the z dimension, while the x and y dimensions of the strip elements remain unchanged. Embodiments with such a strip element SE may be constructed by e.g. four interconnect sections from different metallization planes M1 to M4 with progressively increasing lengths being electrically conductively connected to one another by means of vias. It goes without saying that the individual interconnect sections may include any desired electrically conductive material besides metals and metal alloys. That is, doped polysilicon is also appropriate.

As should be evident, at least two patternable planes made of electrically conductive materials may be utilized embodiments of this type. There is no upward limitation of the number of conductive planes in this case.

Figure 8:
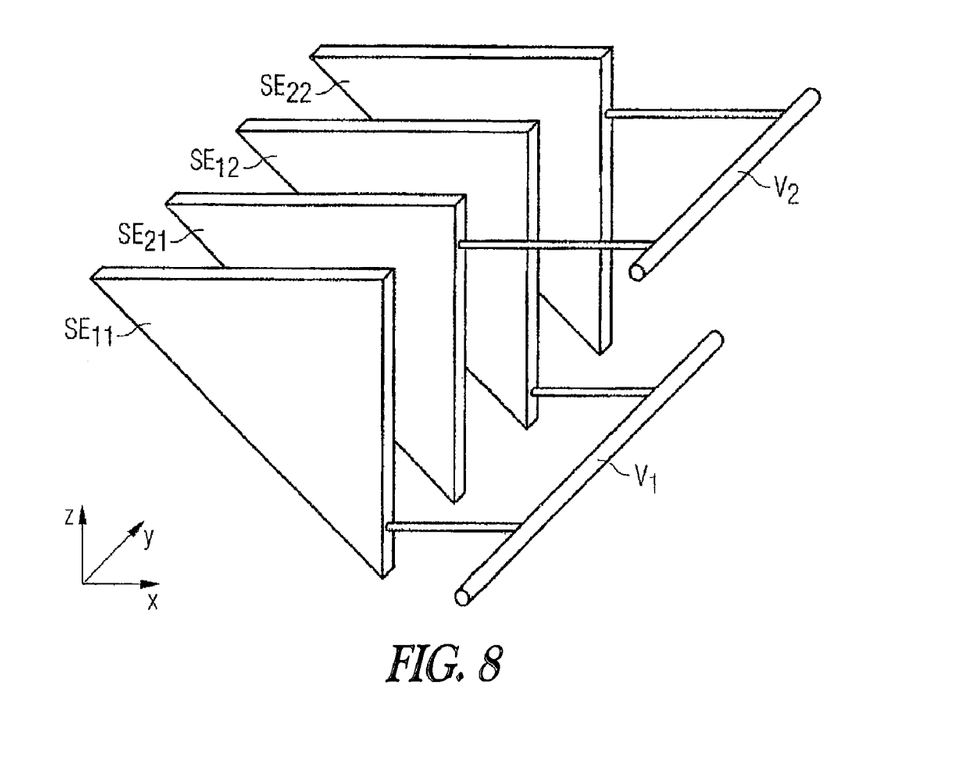
FIG. 8 shows a schematic three-dimensional illustration of some embodiments of an integrated capacitor structure constructed from the capacitor plates illustrated in detail in FIG. 7.

FIG. 8 shows a simplified illustration of a capacitor structure constructed from four strip elements $SE_{11}$, $SE_{12}$, $SE_{21}$ and $SE_{22}$. In this case, these four individual strip elements may be constructed in accordance with the principle that was explained in more detail with reference to FIG. 6. For reasons of simplification, these elements are illustrated here as triangular plates. The plates are interlinked with one another and, by way of alternate connection, are coupled to connecting elements $V_1$ and $V_2$, respectively, which constitute a first and second electrode, respectively, of the capacitor arrangement.

The capacitor structure may be embodied in a metallization plane, which is often part of the semiconductor component. In addition a stack sequence of substantially identically shaped strip elements may be constructed by way of through-plating, e.g. by way of vias, to further enhance area utilization. The interconnection of elements in n planes may result in an n-fold increase in the capacitance value. The capacitances of the connecting elements (vias), which in practice also provide an additional increase in the total capacitance, have been disregarded in this quantitative estimation.

One advantage of this arrangement is that a portion of the metallization planes, in particular of the metallization planes near the substrate in the present example, is furthermore available for rewiring purposes.

Figure 9:
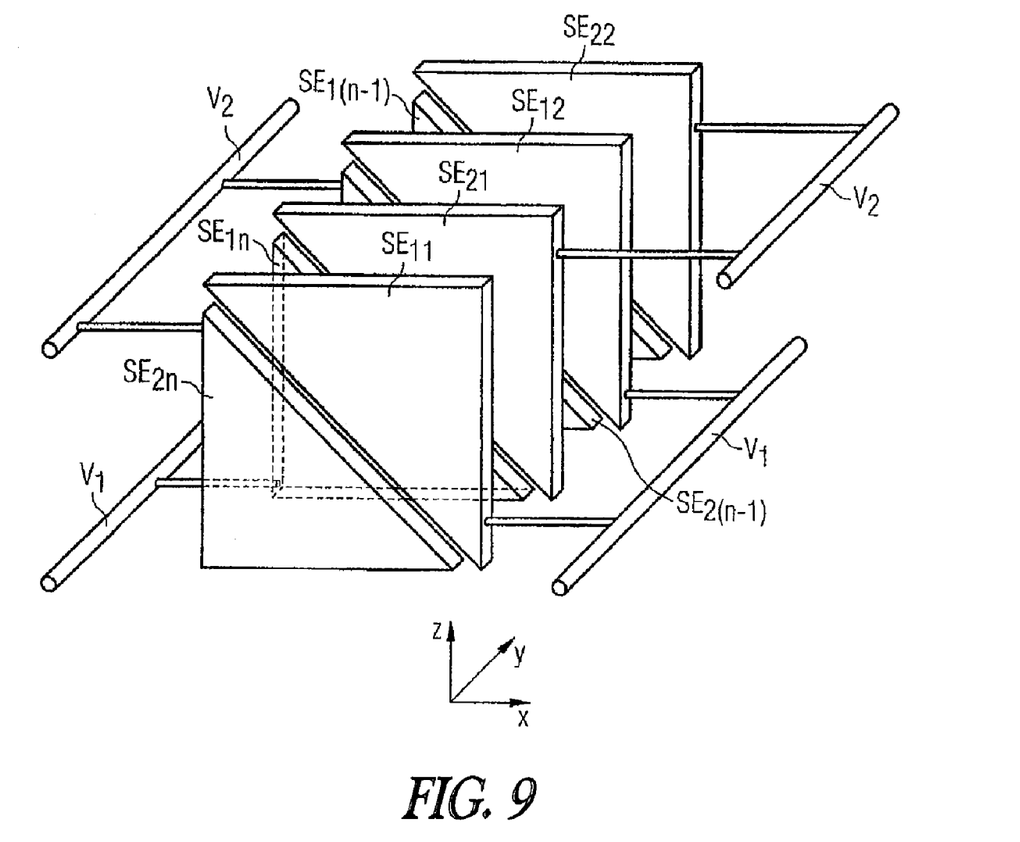
FIG. 9 shows a schematic three-dimensional illustration of some embodiments of an integrated capacitor structure likewise constructed from the capacitor plates illustrated in detail in FIG. 7.

As shown in FIG. 9, however, the hitherto unused portion of the metallization planes may also be used for shaping a further partial capacitor structure. In this embodiment, two times two groups of strip elements are constructed. The first two groups may be the same as the embodiment illustrated in FIG. 7. That is to say that a first capacitor partial structure may be constructed from four strip elements $SE_{11}$, $SE_{12}$, $SE_{21}$ and $SE_{22}$, $SE_{11}$ and $SE_{12}$ being electrically conductively connected to one another by way of $V_1$ and constituting a first electrode of the first capacitor arrangement $SE_{21}$ and $SE_{22}$ may be electrically conductively connected to one another by way of $V_2$, and thus constitute a second electrode of the first capacitor arrangement. The second two groups of strip elements may be arranged in such a way that they in each case to fill the area unused by the first two groups in the x-z plane. $SE_{2n}$ and $SE_{2(n-1)}$ may be connected to the second electrode of the capacitor arrangement by means of $V_2$, and $SE_{1n}$ and $SE_{1(n-1)}$ may be connected to the first electrode by way of $V_1$.

In order to also utilize the horizontal capacitances, two respective capacitor plates having different polarities may be situated opposite one another in each x-z plane. Embodiments in which capacitor plates having the same polarity are situated opposite one another are also possible, although the horizontal capacitor portion remains unused in such embodiments and leads to a reduction of the total capacitance available.

The capacitor structure may also be integrated directly into the semiconductor substrate. By way of example, all of the strip elements may be embodied by doping with a first doping type within the first substrate, the strip elements having different polarities being isolated by way of a suitable insulation. In some embodiments the doping is performed by using an STI oxide (Shallow Trench Isolation) by using a LOCOS oxide (Local Oxidation of Silicon) or by a deep trench etch. In some embodiments, all dopable, in particular high dopable semiconductor materials, such as silicon, germanium or gallium arsenide (GaAs), are used as possible substrate materials. In some embodiments, the capacitor structure is also situated within a doped well within a semiconductor substrate.

Figure 10:
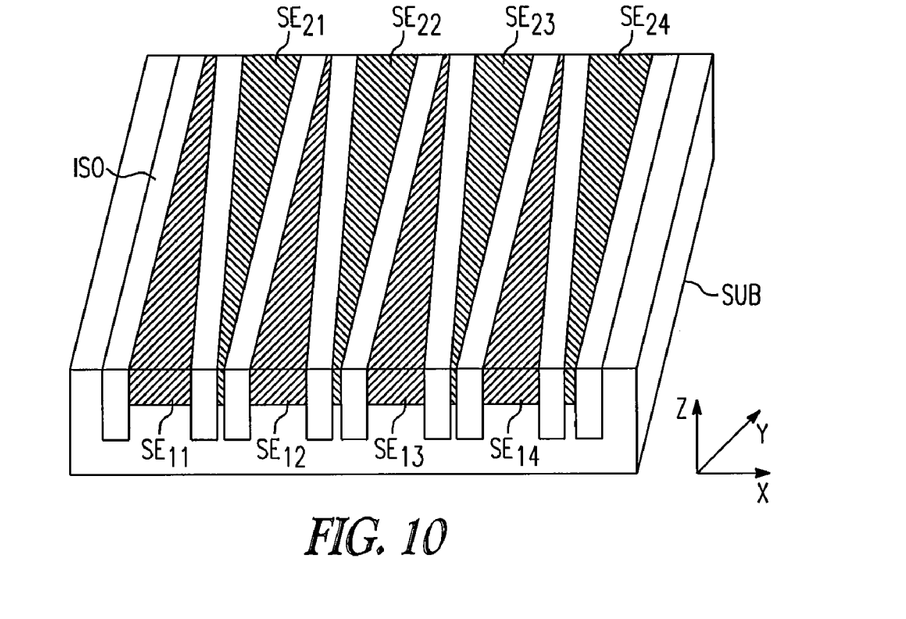
FIG. 10 shows a three-dimensional illustration of an integrated capacitor structure in accordance with some embodiments.

FIG. 10 schematically depicts an embodiment of a capacitor arrangement integrated into the semiconductor substrate Sub. The strip elements SE are produced by patterned doping of the semiconductor substrate Sub and are electrically isolated from one another by way of insulated regions Iso. All customary dopants, in particular arsenic (As), boron (B) or phosphorus (P) may be used as doping materials. Four strip elements $SE_{11}$, $SE_{12}$, $SE_{13}$, and $SE_{14}$ are connected to a first electrical potential by way of first connecting elements (not illustrated) and thus constitute a first electrode, and four strip elements $SE_{21}$, $SE_{22}$, $SE_{23}$ and $SE_{24}$ may be connected to a second electrical potential by way of second connecting elements (likewise not illustrated) and thus constitute a second electrode.

In another embodiment, the capacitor structure may be integrated directly into the semiconductor substrate by embodying first strip elements in a first doping type and second strip elements in a second doping type, which may be different from the first doping type. On account of the formation of an electrically insulating space charge zone, that is to say a pn junction, between adjacent electrodes, further mutual insulation of the strip elements may not be required. A capacitor arrangement of this type may also be situated within a doped well in a semiconductor substrate.

Figure 11:
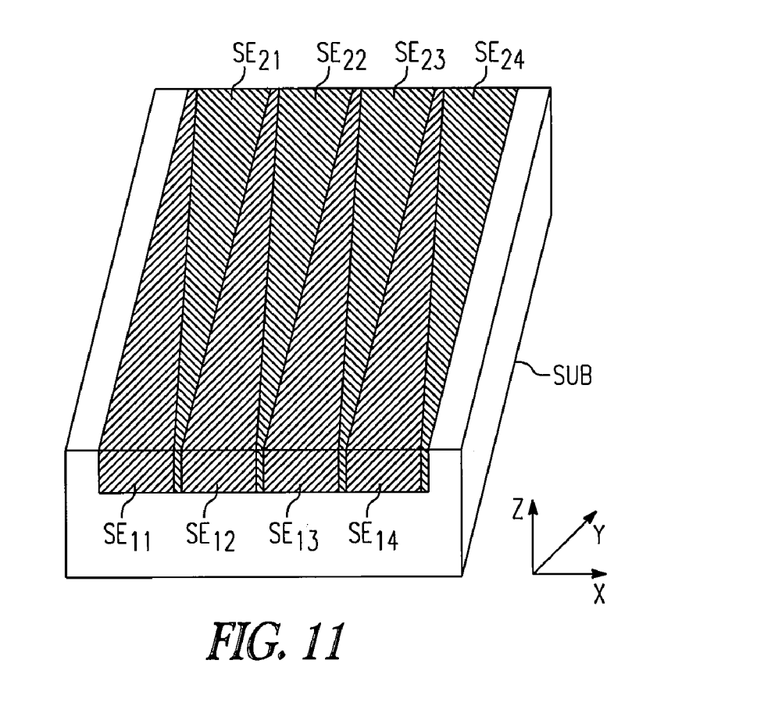
FIG. 11 shows a three-dimensional illustration of an integrated capacitor structure in accordance with some embodiments.

FIG. 11 shows an embodiment of a capacitor arrangement integrated into the semiconductor substrate Sub. All customary dopant combinations for producing pn junctions, in particular combinations of III/V semiconductors such as boron (B) and phosphorus (P), may be used as doping materials. By producing the strip elements having the first polarity $SE_{11}$ to $SE_{1n}$ with a first doping type and the strip elements having the second polarity $SE_{21}$ to $SE_{2n}$ with a second doping type, it is possible to dispense with an electrical insulation between the strip elements that are interlinked in one another. A junction capacitance is formed nonetheless, on account of the different doping types between two adjacent doping regions.

Figure 12:
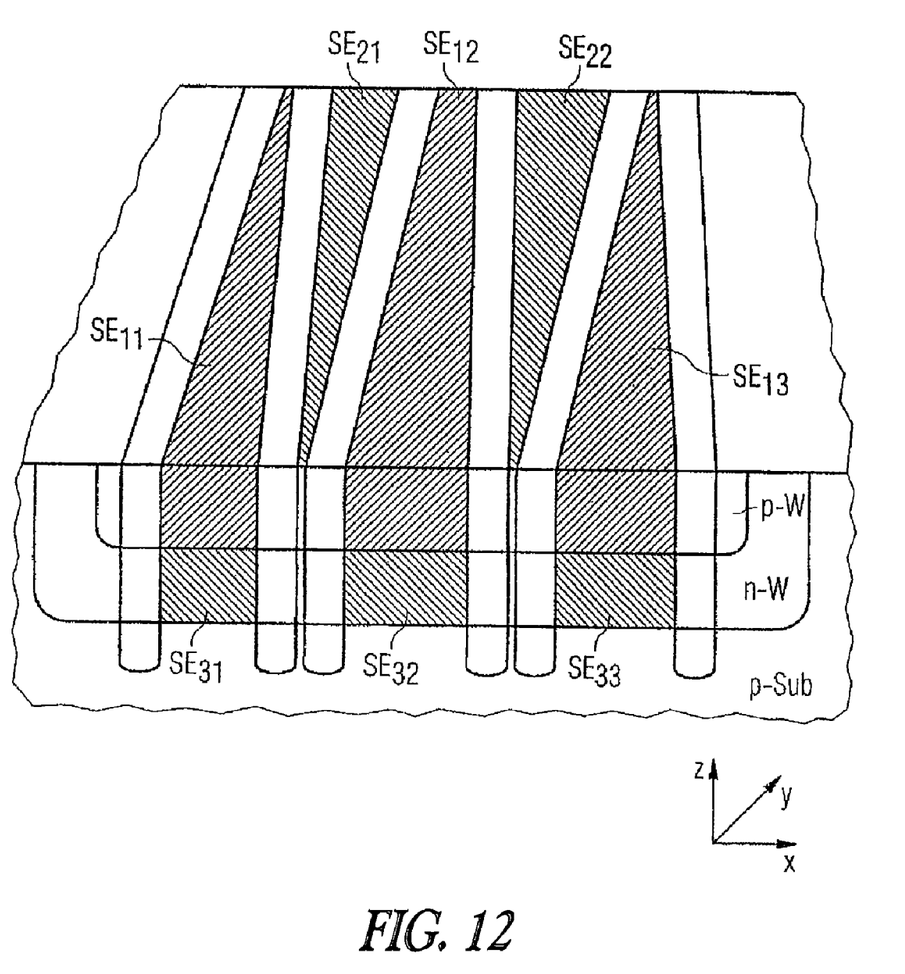
FIG. 12 shows a three-dimensional illustration of an integrated capacitor structure in accordance with some embodiments.

FIG. 12 shows an embodiment of a capacitor arrangement integrated into the semiconductor substrate Sub, strip elements $SE_{11}$, $SE_{12}$, $SE_{13}$, $SE_{21}$, and $SE_{22}$ being arranged in a so-called triple well. Situated within the p-doped substrate is an n-doped, first well, in which, in turn, a p-doped, second well may be arranged. On account of the different doping between substrate Sub, first well and second well, a pn junction forms at the vertical interface between the two wells and permits, on account of the junction capacitance generated thereby, the formation of strip elements $SE_{3n}$ and $SE_{4n}$ (not illustrated on account of the perspective) in a further plane. In this case, the strip elements of the third group $SE_{3n}$ may be situated exactly below those of the first group $SE_{1n}$ and the strip elements of the fourth group $SE_{4n}$ are now situated exactly below those of the second group $SE_2$ n.

In this embodiment, the strip elements $SE_{1n}$ and $SE_{2n}$ may be contact-connected with the opposite electrical potential with respect to their immediate vertical neighbors $SE_{3n}$ and $SE_{4n}$. This ensures that the pn junctions are reverse-biased even in the charged state of the capacitor structure and the vertical junction capacitances are thus retained. This has the effect that vertical capacitance portions may also be utilized.

In order to achieve the contact-connection, in some embodiments, two respective connection regions may be used at the side of the integrated capacitor structure. That is to say a first region for strip elements $SE_{1n}$ and $SE_{2n}$ and a second region for strip elements $SE_{3n}$ and $SE_4$ n.

Conclusion

In some embodiments, a strip-type capacitor arrangement is patterned within two metallization planes of a semiconductor component, where substantially parallelepipedal strip elements are alternately connected to a first and a second electrode, respectively, both in vertical and in horizontal succession.

In some embodiments parallelepipedal strip elements in at least two metallization planes form a capacitor structure, here the strip elements being alternately connected up to a first and a second capacitor electrode, respectively, in horizontal succession, whereas they are assigned to in each case the same electrode in vertical succession. This makes it possible to form vertical plates with a multiplicity of vertical plated-through holes—the so-called vias—which brings about an increase in the capacitance.

A semiconductor component may include an integrated capacitor structure that may be constructed from at least one layer of strip elements of a first and a second group that are at least partly interlinked in one another. The two groups of strip elements may constitute the two different polarities of the capacitor structure. The cross-sectional area of at least one of the strip elements from which the capacitor structure is constructed may vary along its linear extent. Therefore, a local adaptation of the cross-sectional area to the charge-reversal currents having in each case locally different magnitudes may occur.

In accordance with the foregoing, good RF properties can be achieved, given the constant capacitance density. In addition good capacitance densities may result, given constant RF properties. Hybrid forms, where both parameters are simultaneously improved, are also possible.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims.

In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim.

Rather, as the following claims reflect, inventive subject matter lies in less than all features of a single disclosed embodiment.

Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

The invention claimed is:

1. A semiconductor component comprising:
an integrated capacitor structure including at least one plane including a plurality of strip elements, a first group of the strip elements constituting a first electrode of the capacitor structure and a second group of strip elements constituting a second electrode of the capacitor structure, wherein the first strip elements together with the second strip elements are at least partly interlinked with one another, and wherein at least one strip element has a non-constant width along its length, wherein at least one strip element has a width diminishing toward a free end thereof, and wherein the strip elements are embodied in at least two metallization planes of the semiconductor component.

2. A semiconductor component comprising:
an integrated capacitor structure including at least one plane including a plurality of strip elements, a first group of the strip elements constituting a first electrode of the capacitor structure and a second group of strip elements constituting a second electrode of the capacitor structure, wherein the first strip elements together with the second strip elements are at least partly interlinked with one another, and wherein at least one strip element has a non-constant width along its length, wherein at least one strip element has a width diminishing toward a free end thereof, and wherein the strip elements are embodied from polysilicon in at least one plane of the semiconductor component.

3. A semiconductor component comprising:
an integrated capacitor structure including at least one plane including a plurality of strip elements, a first group of the strip elements constituting a first electrode of the capacitor structure and a second group of strip elements constituting a second electrode of the capacitor structure, wherein the first strip elements together with the second strip elements are at least partly interlinked with one another, and wherein at least one strip element has a non-constant width along its length, wherein at least one strip element has a width diminishing toward a free end thereof, and wherein the strip elements are embodied by patterned doping of a semiconductor substrate, the strip elements being electrically insulated from one another.

4. A semiconductor component according to claim 3, wherein the strip elements are embodied in a plurality of substrate planes shaped by way of patterned doping.

5. A semiconductor component comprising:
an integrated capacitor structure including at least one plane including a plurality of strip elements, a first group of the strip elements constituting a first electrode of the capacitor structure and a second group of strip elements constituting a second electrode of the capacitor structure, wherein the first strip elements together with the second strip elements are at least partly interlinked with one another, and wherein at least one strip element has a non-constant width along its length, wherein at least one strip element has a width diminishing toward a free end thereof, and wherein the strip elements are embodied both in at least one respective metallization plane and in at least one respective substrate plane shaped by way of patterned doping.

6. A semiconductor component comprising:
an integrated capacitor structure including at least two planes on which a plurality of strip elements is formed, a first group of the strip elements constituting a first electrode of the capacitor structure and a second group of the strip elements constituting a second electrode of the capacitor structure, wherein the first strip elements together with the second strip elements are at least partly interlinked to one another, and wherein at least two of the strip elements from different planes are conductively connected to one another and partly overlapping and have different lengths.

7. A capacitor, comprising:
a substrate;
at least one planar structure above the substrate, including first and second groups of longitudinally extending, alternatingly arranged, conductive strip elements, and first and second laterally extending connecting elements, wherein the first and second connecting elements are conductively connected respectively to the first and second groups of strip elements to provide a pair of capacitor plates, and a width of at least one of the first and second groups of strip elements decreases along at least one longitudinal segment thereof between the connecting element and a longitudinal end thereof,
wherein the strip elements are embodied by patterned doping of a semiconductor substrate, the strip elements being electrically insulated from one another.

* * * * *